(12) United States Patent
Lin et al.

(10) Patent No.: US 6,372,525 B1
(45) Date of Patent: Apr. 16, 2002

(54) WAFER-LEVEL ANTENNA EFFECT DETECTION PATTERN FOR VLSI

(75) Inventors: Chrong Jung Lin, Hsin-Tien; Hsin Ming Chen, Tainan Hsien, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/467,133

(22) Filed: Dec. 20, 1999

(51) Int. Cl.[7] .......................... H01L 21/66; G01R 31/26
(52) U.S. Cl. ............................ 438/14; 257/48; 257/53; 257/428; 257/429; 438/17
(58) Field of Search ...................... 438/14, 309; 257/48

(56) References Cited

U.S. PATENT DOCUMENTS

| | | | |
|---|---|---|---|
| 5,638,006 A | | 6/1997 | Nariani et al. ............. 324/765 |
| 5,650,651 A | | 7/1997 | Bui ............................. 257/355 |
| 5,759,871 A | * | 6/1998 | Hause et al. .................. 438/18 |
| 5,850,149 A | * | 12/1998 | Katayama et al. .......... 324/769 |
| 5,943,550 A | * | 8/1999 | Fulford, Jr. et al. .......... 438/14 |
| 5,963,780 A | * | 10/1999 | Ling et al. ................... 438/14 |
| 5,972,725 A | * | 10/1999 | Wollesen et al. ............. 438/14 |
| 6,010,914 A | * | 1/2000 | Sishiguchi ................... 438/14 |
| 6,020,245 A | * | 2/2000 | Sato ............................ 438/309 |
| 6,037,607 A | * | 3/2000 | Hause et al. ................. 257/48 |
| 6,153,892 A | * | 11/2000 | Ohsono ....................... 257/48 |
| 6,204,516 B1 | * | 3/2001 | Shabde et al. ............... 257/48 |

* cited by examiner

Primary Examiner—Long Pham
Assistant Examiner—Ravi B. Shukla
(74) Attorney, Agent, or Firm—George O. Saile; Stephen B. Ackerman

(57) ABSTRACT

A test structure for evaluating plasma damage in thin gate oxides is formed with a single polysilicon floating gate EEPROM device on which an antenna structure delivers charge to a floating gate through a tunnel oxide. The floating gate extends beyond the MOSFET channel in one direction, passing over field oxide and terminating in a pad over a thin tunnel oxide window formed over an isolated n+ diffusion. The n+ diffusion is connected to a metal antenna structure which is exposed to a processing plasma. Charge accumulated on the antenna during plasma exposure causes a tunnel current to flow through the tunnel oxide, and charge to accumulate on the floating gate. A second extension of the polysilicon floating gate passes over a second field oxide region and terminates in a pad over a thicker oxide formed on a second isolated n+ diffusion. The second n+ diffusion forms the control gate of the EEPROM and is connected by wiring to a probe pad. The device is formed in the saw-kerf region of a product wafer. After exposure of the device to plasma processing, the device is tested in-line with conventional probe testing equipment. Threshold voltage is measured by applying a scanning voltage to the control gate of the EEPROM. The device is capable of determining polarity and magnitude of charge accumulated on the gate from the plasma and is able to distinguish the degree of plasma damage incurred by various plasma processes. The test device has a greater sensitivity than other plasma sensing devices because the threshold voltage can be amplified by the EEPROM.

9 Claims, 5 Drawing Sheets

WAFER-LEVEL ANTENNA EFFECT DETECTION PATTERN FOR VLSI

BACKGROUND OF THE INVENTION

(1) Field of the Invention

This invention relates to testing and diagnostics of line processes used for the manufacture of integrated circuit devices and more particularly to the measurement and monitoring of plasma damage from back-end-of-line processes.

(2) Description of Prior Art

The manufacture of large scale integrated circuits in a mass production facility involves hundreds of discrete processing steps beginning with the introduction of blank semiconductor wafers at one end and recovering the completed chips at the other. The manufacturing process is usually conceived as consisting of the segment wherein the semiconductor devices are formed within the silicon surface (front-end-of-line) and the portion which includes the formation of the various layers of interconnection metallurgy above the silicon surface(back-end-of-line). Most of these processing steps involve depositing layers of material, patterning them by photolithographic techniques, and etching away the unwanted portions. The materials consist primarily of insulators and metal alloys. In some instances the patterned layers serve as temporary protective masks. In others they are the functional components of the integrated circuit chip.

Radio-frequency(rf) plasmas are used extensively in many of these processing steps, in particularly for back-end-of-line. Their usefulness stems from the fact that they are dry processes and they provide the cleanliness and the dimensional and compositional control required in integrated circuit manufacture. Plasma etching processes, in particular Reactive-ion-etching (RIE) permit a high degree of pattern definition and precise dimensional control. RIE combines gaseous chemical etching with unidirectional ion bombardment provided by an rf plasma. Plasma etching, is accomplished at higher pressures, is isotropic although some forms of plasma etching also provide anisotropic etching. Photoresist layers are frequently removed, not by chemical solvents, but more cleanly by plasma aching.

The unfortunate consequences of these numerous exposures of semiconductor wafers to rf plasmas and other forms of ionic radiation, is the occurrence of radiation damage and the accumulation of charge on exposed conductive components which leads to damaging current flows and trapped charge affecting the semiconductor devices.

The most important semiconductor device in current technology is the metal-oxide-silicon-field-effect-transistor (MOSFET). It is a simple device consisting of two shallow regions of one type semiconductor—the source and the drain—separated by a region of another type. The conductivity of the central region(channel) is modulated by applying a voltage to an electrode(gate) which overlies the channel region and is separated from it by a thin insulating layer (gate oxide). CMOS (complementary MOS) technology utilizes MOSFETS in pairs, one an n-type channel device (NMOS) and the other a p-type channel device (PMOS). The simple nature of these devices and their minimal heat dissipation permits an extraordinary degree of miniaturization and consequently a high density of circuits. The gate electrode is no longer made of metal but of heavily doped polysilicon. In the late 1980s the design rule for these devices was 3.5 microns. Today's design rules are approaching 0.18 microns.

The gate insulating layer which overlies the channel region usually consists of thermally grown silicon oxide and is one of the most critical components of the MOSFET. For the 3.5 micron technology this silicon oxide layer is about 600 Angstroms thick. The gate oxide used in 0.25 micron design technology is of the order of only 50 Angstroms. High performance logic devices having gate oxides as thin as 30 Angstroms are reported for 0.18 micron design rules. An insulating film of these dimensions it highly susceptible to damage from external sources during manufacture. A prominent cause of such damage is ion and electron bombardment from plasmas used in the back-end-of-line processing. The surfaces of patterned semiconductor wafers located within a plasma reactor present multiple areas of conductors and insulators to the plasma. These produce local non-uniformities in the plasma currents which result in charge build-up on the electrically floating conductor surfaces.

After the gate oxide layer is formed it is covered with a layer of polysilicon within which the gate electrode is defined. The etching of this polysilicon layer is accomplished by reactive-ion-etching, providing the first in a series of exposures of the gate oxide to an rf plasma. In this instance the area of the gate electrode is covered with photoresist. As etching proceeds the exposed polysilicon provides sufficient conduction to prevent local charge build-up. However, as the endpoint is approached, the polysilicon layer breaks up and residual, now isolated, regions of polysilicon surrounding the photoresist protected gate electrode act as an antenna which accumulate positive charge. This results in the development of a positive potential sufficiently high to cause current flow through the gate oxide. These polysilicon halos can present a high antenna-to-thin oxide area ratio causing massive current flow in the oxide. As etching proceeds, the halos of polysilicon disappear and the antenna area is reduced to the thin edges of the gate electrode itself.

Subsequent sundry processing steps provide multiple exposures of the gate oxide to damage by plasmas and ionizing radiation. The nature of the exposure and the avenues available for reducing it are different and are unique to each processing step.

The mechanism of current flow though a gate oxide is primarily Fowler-Nordheim(FN) tunneling. (FN) tunneling which occurs at fields in excess of 10 MV/cm. Charge build up on the gate electrode resulting in a gate electrode potential of only 10 volts is therefore sufficient to induce FN tunneling through an oxide layer of 100 Angstroms. Such potentials are easily achieved in conventional plasma reactors. Excessive FN tunneling currents eventually lead to positively charged interface traps in the oxide and subsequent dielectric breakdown.

The multiple exposures of the gate oxide to steps involving plasmas has led to the emergence of several test structures designed to amplify the charging exposure and thereby allow proper and timely assessment of the damage delivered by the sundry plasma processing steps (See Wolf, S., *Silicon Processing for the VLSI Era*, Vol3, Lattice Press, Sunset Beach, Calif., Vol.3 (1995),p507–9). These test structures fall into two types: 1) Antenna structures which have large areas of conductor exposed to the plasma as compared to the area of the gate oxide; and 2) large area capacitors which are formed over the gate oxide.

Nariani, et. al., U.S. Pat. No. 5,638,006 shows an antenna structure which is designed to draw charge to a region of thin oxide of an MOS device thereby exaggerating the exposure to damage. Similar antenna structures having charge accumulating pads of various antenna ratios are patterned on successive metallization levels are widely used. Bui, U.S. Pat. No. 5,650,651 shows the use of an auxiliary capacitor which reduces the antenna ratio of a pad on the uppermost layer of metallization of a carrier injection test transistor. The capacitor is formed over thin oxide in a separate region and draws away tunneling current from the test transistor. A Faraday cage type shielded structure for assessing plasma damage is shown by Shiue, et. al., U.S. Pat. No. 5,781,445. A conductive cage shields a reference MOSFET from plasma radiation during a plasma processing step. Comparison of threshold voltage shifts is made between the shielded and unshielded devices after a selected plasma process step and the plasma damage incurred by the unshielded devices is calculated.

These test structures indicate the presence or absence of radiation damage but are not able to adequately pinpoint the processing steps responsible for the damage. In addition they frequently produce ambiguous results because their status at time-of-measurement time does not necessarily reflect previous events. In addition, conventional antenna structures are unable to identify charge polarity and grossly understate charge magnitude because FN tunneling losses. These losses become increasingly significant as the gate oxide thickness decreases below about 70 Angstroms.

SUMMARY OF THE INVENTION

It is an object of this invention to provide an plasma damage test structure which can accurately determine the magnitude and sign of charge accumulated at a MOSFET gate electrode during plasma processing.

It is a further object of this invention to provide a test structure with improved sensitivity to small quantities of charge accumulated on gate electrode surfaces during plasma processing.

It is yet another object of this invention to provide an improved antenna test structure and method for measuring charge accumulation at gate electrodes surfaces during plasma processing with reduced contribution from electron tunneling effects.

It is still another object of this invention to provide a method for measuring polarity and magnitude of charge stored on a gate electrode during plasma processing.

These objects are accomplished by the use of a single polysilicon floating gate EEPROM (Electrically erasable programmable read only memory) device on which an antenna structure delivers charge to the floating gate through a tunnel oxide. The floating gate extends beyond the MOSFET channel in one direction, passing over field oxide and terminating in a pad over a thin tunnel oxide window formed over an isolated n+ diffusion. The n+ diffusion is connected to a metal antenna structure which is exposed to a processing plasma. Charge accumulated on the antenna during plasma exposure causes a tunnel current to flow through the tunnel oxide, and charge to accumulate on the floating gate. A second extension of the polysilicon floating gate passes over a second field oxide region and terminates in a pad over a thicker oxide formed on a second isolated n+ diffusion. The second n+ diffusion forms the control gate of the EEPROM and is connected by wiring to a probe pad. The device is formed in the saw-kerf region of a product wafer. After exposure of the device to plasma processing, the device is tested in-line with a conventional probe tester. By using in-line testing, the wafers never leave the clean environment of the production line. Threshold voltage changes are measured by applying a scanning voltage to the control gate. The measurement is capable of determining polarity and magnitude of charge accumulated on the gate from the plasma and is able to distinguish the degree of plasma damage incurred by various plasma processes. During plasma processing only the metal antenna portion of the test device is exposed to the plasma. The test device has a greater sensitivity than other plasma sensing devices because the threshold voltage can be amplified by the EEPROM. Unlike logic devices, the FN current initiated by the plasma causes charge to be trapped on the floating gate of the EEPROM. The EEPROM's storage capability allows cumulative measurement of current passing through the oxide.

DESCRIPTION OF THE PREFERRED EMBODIMENTS

Figure 1:
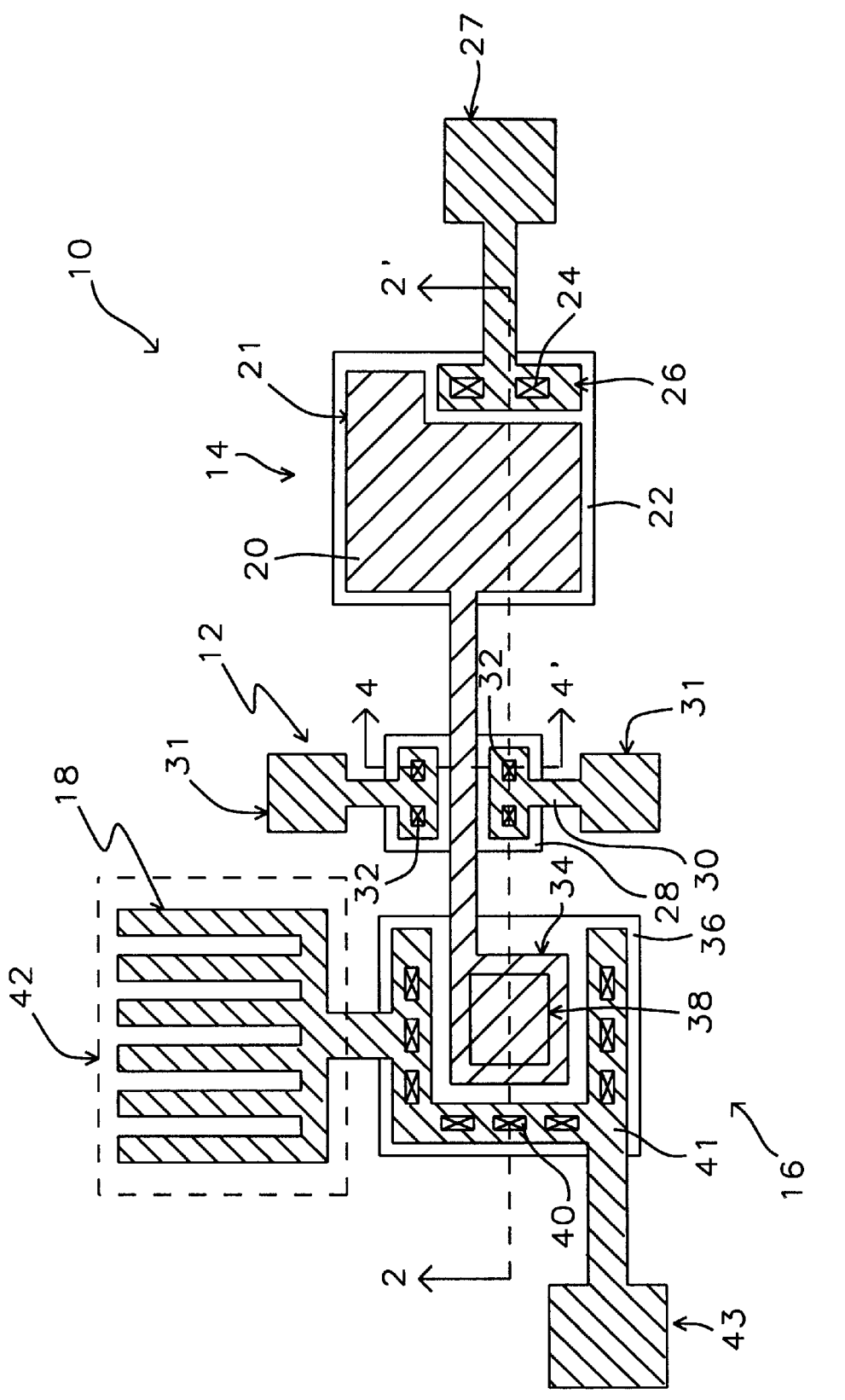
FIG. 1 is a planar view of the plasma damage test structure taught by the present invention.

Referring to FIG. 1 there is shown, in a planar view, the features of a single polysilicon EEPROM plasma damage test structure 10 as configured in an embodiment of this invention. The structure 10 is preferably formed in the saw-kerf region of a conventional silicon wafer containing product chips. In this way the test structures are formed during normal line processing of integrated circuit product without consuming valuable wafer real estate and with minimal deviations from a conventional manufacturing process. Because the structure contains a thin tunnel oxide and a thicker gate oxide, an EEPROM process and processes involving dual gate oxides are most amenable to the formation of the test structure.

The main elements of the structure, shown in planar view in FIG. 1, comprise a MOSFET 12, a control gate region 14, a tunneling region 16 and an antenna structure 18. The polysilicon floating gate 20 is patterned in the control gate region 14 with a pad 21 overlying a gate oxide on an n+ diffusion 22 in the silicon. The n+ diffusion 22 forms the control gate connection to which is brought out by contacts 24 to metal wiring 26 terminating in a probe pad 27. The polysilicon floating gate 20 is self-aligned to the source/drain elements 28 of the MOSFET 12 by conventional MOSFET processing which typically includes the formation of LDD (lightly doped drain) regions. Connections to the source drain elements 28 and made by contacts 32, through metal wiring 30, and terminating at probe pads 31. FIG. 1 shows multiple contacts between the diffused elements and the respective metal wiring. Multiple contacts are often preferred to provide an optimal conductive path. However, in the alternate, if a salicide process is used to form the antenna structure contacts, only a few or even a single contact may be used to make each through connection.

In the tunneling region 16, a pad 34 at the end of floating gate 20 communicates with an n+ diffusion 36 through a tunnel oxide in a tunnel window 38. The tunnel oxide is surrounded by a thicker oxide. The n+ diffusion 36 is connected to a metal antenna pattern 18 by contacts 40.

Figure 2A:
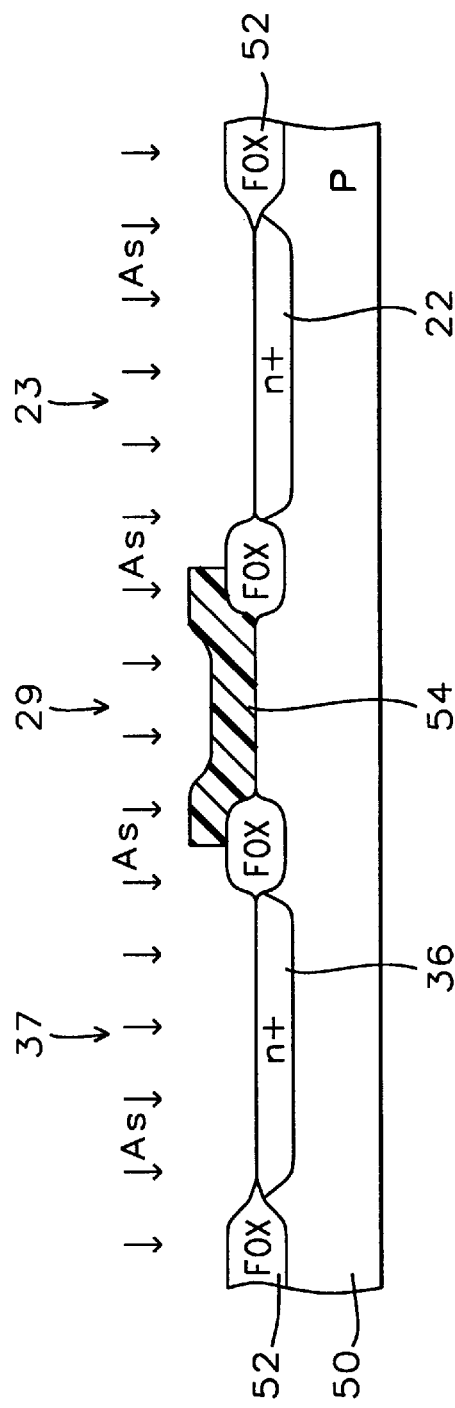
FIG. 2A through FIG. 2D are a cross sectional views of a portion of the test structure described in the embodiment of this invention and illustrating process steps used to form the test structure.

The formation of the test structure will now be described with reference to FIG. 2A through FIG. 2D which are cross sections along the line 2–2' of FIG. 1 illustrating the processing steps used to form the test structure 10. Referring first to FIG. 2A, in an embodiment of the invention, a p-type monocrystalline silicon wafer 50 is provided. A field oxide isolation (FOX) 52 is formed on the wafer 50 by the well known LOCOS (local oxidation of silicon) method whereby selected regions on the wafer 50 are oxidized through a silicon nitride/pad oxide oxidation mask. In this manner, windows 37, 29, and 23 are formed to expose silicon regions for forming diffused device elements. The field oxide is between about 0.3 and 0.5 microns thick.

Alternately, STI (shallow trench isolation) may be used to form the field oxide isolation regions 52. STI is a newer but well known isolation method wherein shallow trenches are etched into the silicon substrate 50. After lining the trenches with a thin layer of thermal silicon oxide, an insulative material such as silicon oxide is deposited by CVD to fill the trenches. The wafer surface is then planarized by CMP (chemical mechanical polishing) leaving the deposited insulative material in the trenches. Typically a layer of silicon nitride is deposited over the oxide liner prior to filling the trenches. STI is well known in the art and has gained favor over LOCOS field isolation because of it's better compatibility with today's high density sub-micron integrated circuit technology. The development of CMP has played an important role in the successful use of STI.

Figure 3:
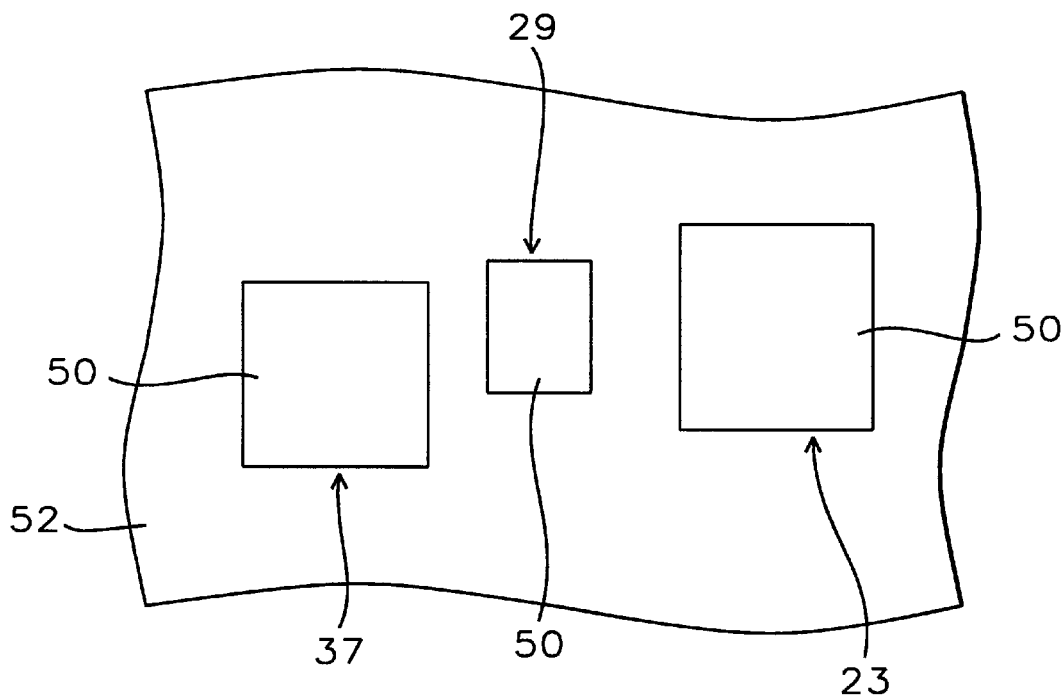
FIG. 3 is a planar view showing the islands of active silicon surrounded by field oxide isolation used to form the plasma damage test structure described by this invention.

FIG. 3 is a planar view showing the field oxide 52 with windows 37, 29, and 23 exposing silicon 50 for the diffusions 36, 28, and 22 respectively. The n+ diffusion 22 for the control gate and the n+ diffusion 36 to which the antenna 18 connects are next formed by masking the window 29 with a photoresist mask 54 and implanting arsenic ions into the silicon wafer at a dose of between about $1\times10^{13}$ and $5\times10^{15}$ ions/cm$^2$ and an energy of between about 25 and 100 keV. The window 29 is masked because the n+ region 28 is formed after the floating gate electrode is in place.

Figure 2B:
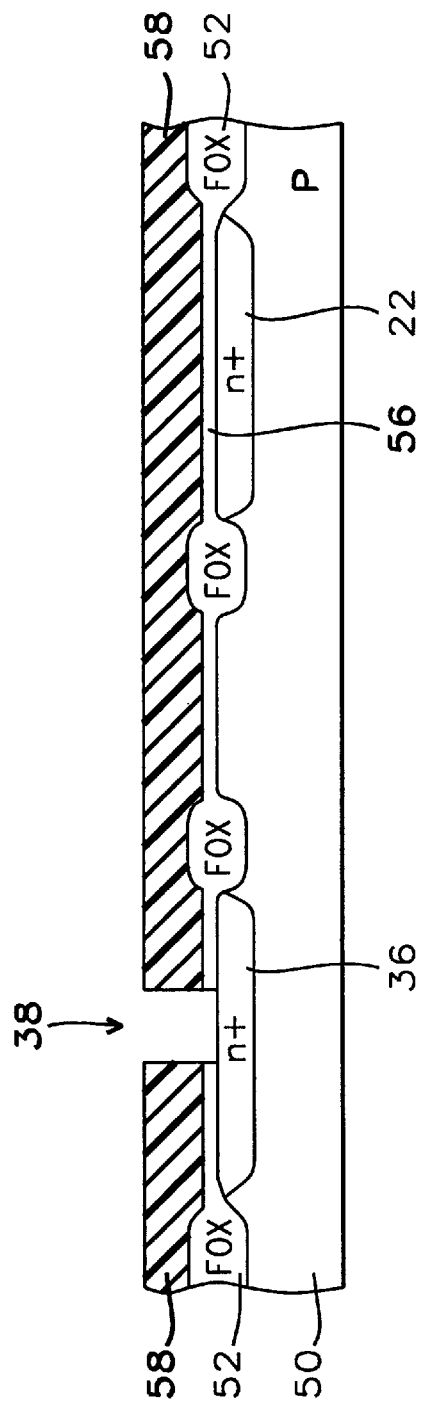
Figure 2C:
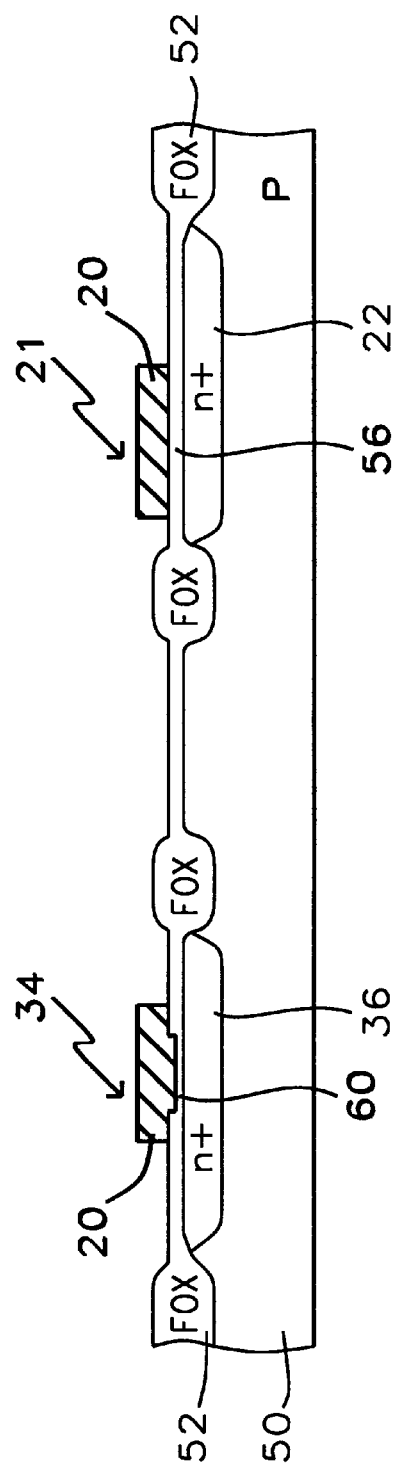

The photoresist mask 54 is stripped using conventional liquid strippers or by plasma ashing and, referring to FIG. 2B, a gate oxide 56 between about 80 and 300 Angstroms thick is grown by thermal oxidation. Procedures for growing gate oxides by thermal oxidation are well known by those in the art. A small 38 is then etched in the gate oxide 56 by patterning a photoresist layer 58 and etching the gate oxide 56 in dilute aqueous HF. A dilute buffered HF etch, commonly referred to as BOE may alternatively be used. The photoresist 58 is stripped and, referring to FIG. 2C, a tunnel oxide 60 is grown in the window 38 to a thickness of between about 75 and 100 Angstroms. The tunnel oxide 60 is grown at a temperature of between about 750 and 950° C.

After the tunnel oxide 60 is formed, a floating polysilicon gate 20 is patterned on the wafer 50. In the cross section, only the portion 21 over the control gate diffusion 22 and the pad over the tunnel oxide 60 can be seen. However, it will be appreciated by reference to FIG. 1 that the floating gate 20 is continuous between the two pad elements 21 and 34, bridging over the field oxide opening 29 wherein the MOSFET 12 is next formed. At one end the floating gate 20 passes over field oxide and terminates in a first pad 34 over the tunnel oxide 60. At the other end the floating gate terminates in a second pad 21 on the portion of gate oxide 56 over the control gate diffusion 22. The layer stack from which the floating gate 20 is patterned can be any conventional laminar gate process, for example a doped polysilicon layer over an undoped layer, or a polycide (metal suicide over polysilicon) layer. An insulative cap layer may also be included on top of the conductive portion of the gate stack.

Figure 4A:
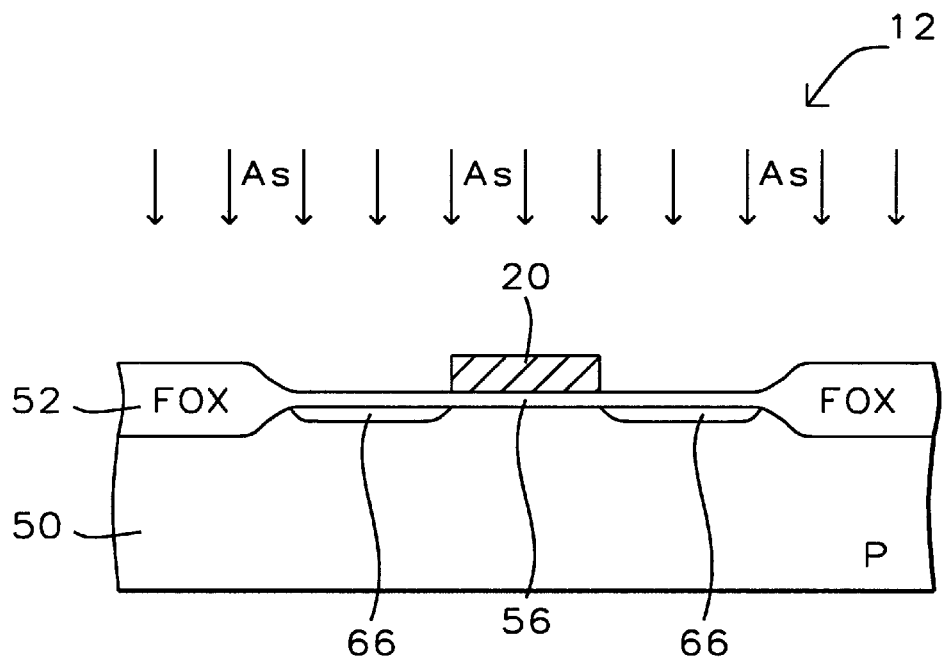
FIG. 4A and FIG. 4B are a cross sectional view of another portion of the test structure described in the embodiments of this invention illustrating the process steps for the formation of the elements of the MOSFET device which is serviced by the floating gate according to the teaching of this invention.
Figure 4B:
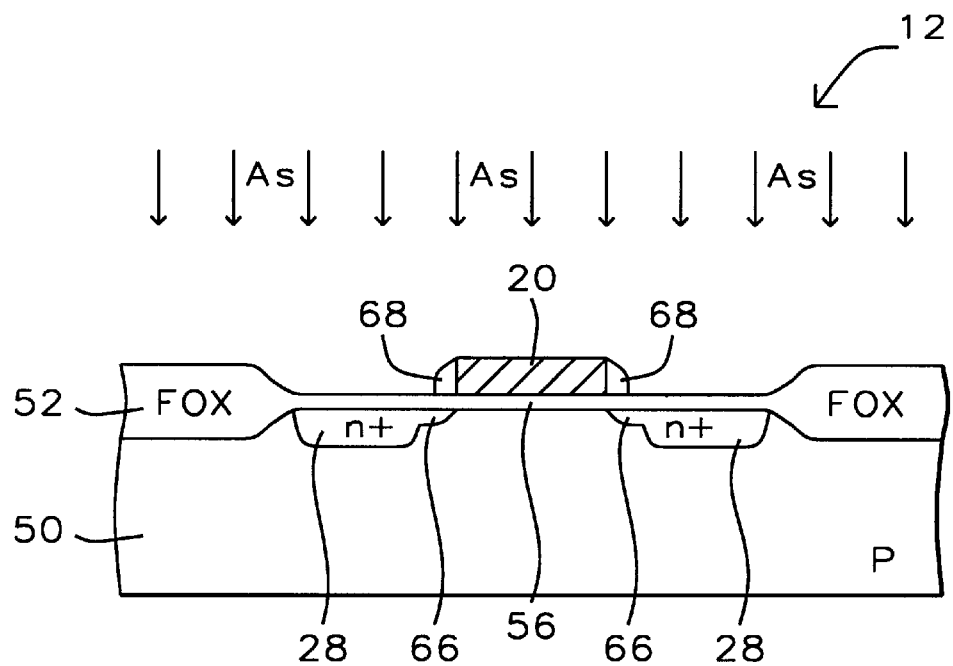

Referring to FIG. 4A, there is shown a cross section of the wafer 60 along the line 4–4' in FIG. 1 after the polysilicon floating gate has been patterned. LDD regions 66 are formed adjacent to and self-aligned to the gate by implanting arsenic ions at a dose of between about $1\times10^{14}$ and $1\times10^{15}$ ions/cm$^2$ at an energy of between about 10 and 50 keV into the wafer 50. Referring to FIG. 4B, sidewalls 68 are formed along the periphery of the floating gate by depositing a conformal layer of an insulator such as silicon oxide by a CVD (chemical vapor deposition) method and then anisotropically etching the layer back to the silicon leaving the sidewalls 68. This technique is well known and widely practiced in the industry. Using the sidewalls as spacers, arsenic ions at a dose of between about $1\times10^{15}$ and $8\times10^{15}$ ions/cm$^2$ are implanted at an energy of between about 20 and 60 keV to complete the formation of the source/drain elements 28 of the MOSFET 12.

Figure 2D:
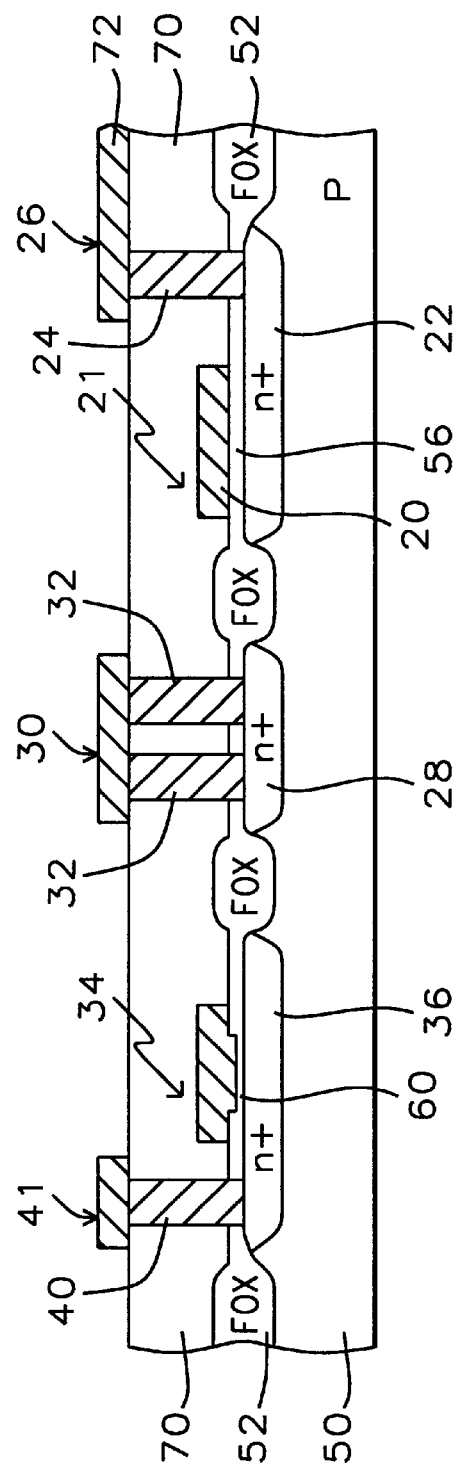

Referring now to FIG. 2D, the source/drain diffusion 28 now appears in the 2–2' cross section. An ILD (interlevel dielectric) layer 70 is deposited over the wafer 10 and planarized. The ILD layer 70 in the present embodiment is preferably formed by depositing a layer of silicon oxide by PECVD (plasma enhanced chemical vapor deposition) and planarizing it to a thickness of between about 0.6 and 1.0 microns by CMP. Deposition and planarizing by these techniques are well known and widely practiced in the art. Alternately, other insulative materials as well as other deposition and planarization methods may be employed to form the ILD layer 70.

Contacts 24, 32, 40 are formed in the ILD layer 70 connecting respectively to the diffusion 36, the source/drain element of the MOSFET 28 and the control gate diffusion 22. A metal layer 72 is patterned over the ILD layer 70 to form 1) an antenna structure 18 (FIG. 1) connected to the diffusion 60 by way of wiring 41 and contact 40 and having an attached probe pad 43, 2) probe pads 31 connected to the source/drain elements of the MOSFET 12 by metal wiring 30 and contacts 32, and 3) a conductive path between the control gate diffusion 22 and probe pad 27 through contacts 24 and wiring line 26. A grounding connection (not shown) to the substrate region 50 is provided through an additional contact and metal wiring to a probe pad.

The metal antenna structure 18 is preferably of a comb shape as shown in FIG. 1. Alternately the antenna structure may be a rectangular plate. The critical parameter is the ratio of the antenna area with respect to the gate oxide area. An antenna area-to-gate oxide area ratio of between about 400:1 and 1200:1 is preferred for optimum performance.

An insulative layer (not shown in FIG. 2D), preferably of photoresist, is coated and patterned on the wafer to have an opening 42 (FIG. 1), exposing the antenna structure. The same patterned insulative layer may also be used to selectively expose regions on product dice to the plasma processing. Before exposing the antenna to the plasma process, a reference electrical scan is performed by bench testing on a conventional probe tester. A scanning voltage is applied to the control gate and the drain current $I_d$ of the device is measured. A representative plot of the reference measurement of $I_d$ versus $V_{CG}$ is shown by the dashed line 70 in FIG. 5. The reference scan must be performed after the metal layer 72 has been patterned. Thus the original reference threshold voltage is not available until that point in the processing.

Figure 5:
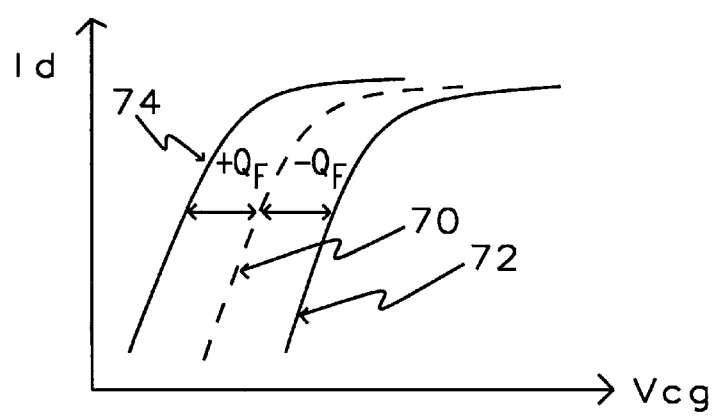
FIG. 5 is a graph illustrating the results of electrical data obtained from measurements of the test structure described by this invention.

The device is next subjected to the plasma process and then re-measured as before. A second curve is plotted and the voltage shift between the curves is converted to a value of charge $Q_F$ collected from the plasma process by the formula (1) which is well known in flash memory testing.

$$V_F - V_{ini} = \Delta V_t = \Delta Q_F / C_{tot}. \tag{1}$$

where
- $V_F$=the voltage on the floating gate
- $V_{ini}$=the initial threshold voltage
- $\Delta V_t$=the threshold voltage shift
- $Q_F$=the plasma charge collected on the floating gate
- $C_{tot}$=total capacitance In FIG. 5, the curve 72 represents a negative charge $(-Q_F)$ collected and curve 74 a positive charge $(+Q_F)$ collected. After testing steps may be to minimize the value of $Q_F$ by making adjustments to the plasma process. Routine measurements of the device on in-process wafers provides a sensitive monitoring method capable of detecting process aberrations which can usually be remedied in a timely fashion.

The EEPROM plasma damage test structure may be used to evaluate effects of plasma exposure during later processing steps which are used in the formation of additional wiring levels. One method is to keep the window 42 over the first antenna pattern 18 open in later deposited layers so that the antenna 18 may again be exposed to plasmas during subsequent processing steps. Alternately, corresponding antenna structures may be formed in the higher metallization levels on other ILD or IMD (inter metal dielectric) layers and interconnected by wiring and vias to the n+ diffusion 36. Key to operation of the test device at higher process levels is the provision of a conductive path from a higher level antenna structure to the n+ diffusion 36. In addition the probe pads 27 and 21 may be formed or brought through to higher levels by vias and interlevel wiring.

It will be apparent to one skilled in the art that charge accumulated on the floating gate after plasma exposure may be measured at-bench between processing steps and the device may then be discharged or re-set for later measurements of additional gate oxide damage after another plasma exposure. In-line bench measurements are performed by mounting the wafer on a stage of a probe tester, attaching probes to probe pads of the test device and applying test voltages. By in-line bench measurements, it is meant that the bench measuring equipment is located and maintained within the clean environment of the processing line. After the measurement are made the test device is reset by discharging the floating gate and the wafer is re-inserted into the processing line.

The initial threshold voltage is preferably measured on a dummy structure. The dummy structure is identical to the test structure but does not have an antenna portion. A source drain voltage of approximately 0.1 Volt is applied to one of the probe pads 31 with the opposite probe pad 31 grounded. A scanning voltage, $V_{CG}$, is then applied to the control gate probe pad 27 and a threshold voltage is determined from the behavior of the measured drain current Determination of the threshold voltage of a MOSFET by applying a scanning a voltage to the gate while measuring source/drain current is a well known measurement procedure and will be easily comprehended by those in the art. The threshold voltage of the test structure with attached antenna is then measured. The antenna itself must be grounded through probe pad 43 during the threshold voltage measurement. The charge accumulated on the floating gate during the plasma patterning of the antenna causes a shift of the threshold voltage in the manner shown in FIG. 5. The test structure may be reset by discharging the floating gate with the antenna grounded. After resetting, a new initial threshold voltage is measured and the structure may again be exposed to a plasma for another plasma charging measurement.

The embodiments described and illustrated by FIGS. 1 through 4 use a p-type substrate. It should be well understood by those skilled in the art that n-type substrate conductivities may also be used with p-type implantations to form the device. It should be further understood that the substrate conductivity type as referred to here does not necessarily refer to the conductivity of the starting wafer but could also be the conductivity of a diffused region within a wafer such as a well wherein the semiconductor devices are incorporated.

While the invention has been particularly shown and described with reference to the preferred embodiments thereof, it will be understood by those skilled in the art that various changes in form and details may be made without departing from the spirit and scope of the invention.

What is claimed is:

1. A method of forming an EEPROM plasma damage test structure comprising:

(a) providing a silicon wafer with a region of a first conductivity type;

(b) forming a field oxide on said wafer with regions of active silicon exposed in a first opening, a second opening, and a third opening in said field oxide;

(c) implanting ions of a second conductivity type into said first opening and said second opening while masking said third opening, thereby forming a first conductive region in said first opening and control gate region in said second opening;

(d) forming a gate oxide in each of said openings by thermal oxidation;

(e) masking said gate oxide to define a tunnel oxide window in said first opening and etching said gate oxide in said window;

(f) forming a tunnel oxide in said window;

(g) depositing a polysilicon gate stack layer over said wafer;

(h) patterning said gate stack layer to form a floating polysilicon gate which bridges over said respective gate oxide in said third opening, extending in one direction, passing over a first region of said field oxide and terminating in a first pad over and completely covering said tunnel oxide window and extending in another direction, passing over a second portion of said field oxide and terminating in a second pad which partially covers said respective gate oxide in said second opening;

(i) forming source/drain elements, aligned to said floating polysilicon gate in said third opening by implanting ions of said second conductivity type into said wafer thereby forming a MOSFET in said third opening;

(j) depositing an interlevel dielectric layer on said wafer;

(k) planarizing said interlevel dielectric layer;

(l) forming a plurality of conductive contacts through contact openings in said interlevel dielectric layer connecting to said first conductive region, said control gate, and said source/drain elements;

(m) patterning a metal layer over said interlevel dielectric layer to form an antenna connected by wiring to respective said contacts which, in turn, connect to said first conductive region, two probe pads, each one connected by wiring to respective said contacts which, in turn connect to said source and said drain elements, and a third probe pad connected by wiring to respective said contacts which, in turn, connect to said control gate;

(n) depositing an insulative layer over said wafer; and (o) patterning an opening in said insulative layer to expose said antenna.

2. The method of claim 1 wherein said first conductivity type is p-type and said second conductivity type is n-type.

3. The method of claim 1 wherein said gate oxide is between about 80 and 300 Angstroms thick.

4. The method of claim 1 wherein said tunnel oxide is between about 75 and 100 Angstroms thick.

5. The method of claim 1 wherein said antenna is comb shaped.

6. The method of claim 1, herein said antenna is a rectangular plate.

7. The method of claim 1 wherein the area of said tunnel oxide window has an area of between about 0.25 and 25 square microns.

8. The method of claim 1 wherein said insulative layer is photoresist.

9. A method of measuring charge accumulated on a metal surface during plasma exposure comprising:

(a) providing a test structure comprising an antenna which is connected to access the floating gate of an EEPROM through a tunnel oxide;

(b) measuring an initial threshold voltage of said EEPROM;

(c) exposing said antenna to a plasma process;

(d) measuring a final threshold voltage of said EEPROM;

(e) calculating a threshold voltage shift; and (f) converting said threshold voltage shift to an accumulated charge.

* * * * *